(12) United States Patent
Skinner et al.

(10) Patent No.: US 6,515,870 B1
(45) Date of Patent: Feb. 4, 2003

(54) PACKAGE INTEGRATED FARADAY CAGE TO REDUCE ELECTROMAGNETIC EMISSIONS FROM AN INTEGRATED CIRCUIT

(75) Inventors: Harry G. Skinner, Beaverton, OR (US); Sam E. Calvin, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/722,935

(22) Filed: Nov. 27, 2000

(51) Int. Cl.[7] .............................. H05K 7/14; H05K 7/18
(52) U.S. Cl. ...................... 361/800; 361/816; 361/818; 257/691
(58) Field of Search .................. 361/760–769, 361/799, 800, 816, 818; 174/52.2, 260–262; 439/70.71, 497; 257/691–692, 693–695, 728, 696

(56) References Cited

U.S. PATENT DOCUMENTS

| | | | | |
|---|---|---|---|---|
| 5,479,319 A | * | 12/1995 | Werther | 361/784 |
| 5,585,671 A | * | 12/1996 | Nagesh et al. | 257/697 |
| 5,767,583 A | * | 6/1998 | Lee et al. | 257/786 |
| 5,982,635 A | * | 11/1999 | Menzies et al. | 361/790 |
| 5,998,869 A | * | 12/1999 | Lin et al. | 257/666 |
| 6,246,113 B1 | * | 6/2001 | Lin | 257/692 |

* cited by examiner

Primary Examiner—David L. Talbott
Assistant Examiner—Tuan Dinh
(74) Attorney, Agent, or Firm—Schwegman, Lundberg, Woessner & Kluth, P.A.

(57) ABSTRACT

An integrated circuit (IC) includes a package-integrated Faraday cage assembly to reduce the level of electromagnetic radiation emanating from the IC during operation. The IC uses a number of appropriately spaced leads on the IC package to form part of a Faraday cage surrounding a semiconductor chip within the IC. In one approach, the selected leads are coupled by a conductive member to a conductive cover plate of the IC package that forms an upper boundary of the Faraday cage. When the IC is installed in an external circuit, some or all of the selected leads are coupled together outside of the IC package (e.g., to an electrical ground) to form the lower boundary of the Faraday cage.

28 Claims, 6 Drawing Sheets

US 6,515,870 B1

PACKAGE INTEGRATED FARADAY CAGE TO REDUCE ELECTROMAGNETIC EMISSIONS FROM AN INTEGRATED CIRCUIT

FIELD OF THE INVENTION

The invention relates generally to integrated circuits and, more particularly, to structures and techniques for reducing electromagnetic radiation from integrated circuits.

BACKGROUND OF THE INVENTION

Some types of integrated circuits (ICs) are known to radiate a relatively large amount of electromagnetic energy during periods of operation. For example, microprocessors and other digital processing devices are recognized as a major source of electromagnetic radiation in computer systems. The electromagnetic energy radiated by such devices can interfere with the operation of other devices or circuits in the vicinity of the radiating IC and is therefore undesirable. For this reason, electromagnetic interference (EMI) standards have been developed to place limits on the amount of radiation that ICs can generate during operation.

A number of techniques have been used in the past to reduce the level of radiation emanating from an IC. In one prior approach, for example, a conductive cage structure is formed about the IC using a stamped sheet metal cage member that has a plurality of legs spaced about a periphery thereof. The cage member is placed over the IC package where it is coupled to a cover plate of the package. Each of the legs of the cage member is coupled to a corresponding ground pad on an underlying circuit board. The ground pads of the circuit board are each conductively coupled to a ground plane of the circuit board using, for example, via connections. In this manner, a conductive shield is formed about the IC that will confine most of the electromagnetic energy radiated by the IC within a bounded area surrounding the IC during subsequent operation. A conductive shield such as this is known as a Faraday cage. The spacing between adjacent legs of the cage member is related to the maximum expected radiation frequency of the IC. That is, the legs need to be closer together to contain higher frequencies than they need to be to contain lower frequencies.

As can be appreciated, implementation of the above described approach will typically consume a relatively large amount of real estate on the underlying circuit board. That is, the ground pads to which the legs of the cage member are to be coupled will require a considerable amount of surface space on the circuit board that would otherwise be available to other circuitry. In addition, the above approach will typically require a significant amount of assembly time to, for example, correctly attach the cage member to the IC package with the legs of the cage member properly aligned with and coupled to the ground pads. Furthermore, because the frequencies of ICs are continually increasing, the distance between adjacent legs of the cage member in the above approach will need to be reduced over time. This will require an even greater number of ground pads on the circuit board and even more assembly time to implement. Eventually, a point will be reached where it is not practical to add further legs to the cage member and adequate EMI suppression will not be possible using the above approach.

DETAILED DESCRIPTION

Figure 1:
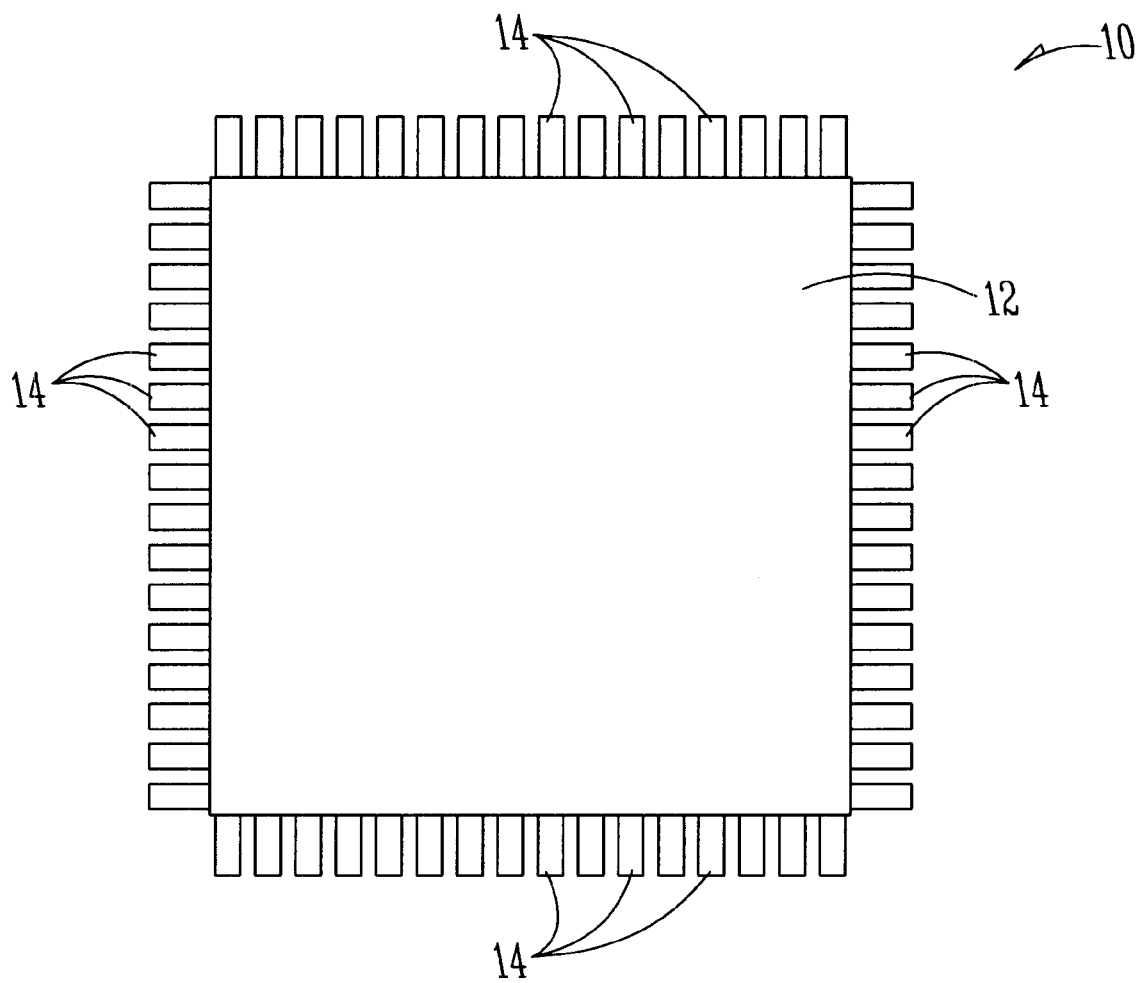
FIG. 1 is a simplified top view of an integrated circuit (IC) that can be modified in accordance with the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to an integrated circuit (IC) having a package integrated Faraday cage for reducing the level of electromagnetic radiation emanating from the IC during operation. The IC uses some or all of the leads of the corresponding IC package as part of the Faraday cage. The selected leads are spaced from one another by a distance that is designed to adequately contain electromagnetic energy within an operational frequency range of the IC. In one approach, the selected leads are conductively coupled to a metallic cover plate (or other metallic plate structure) of the IC package to form an upper boundary of the Faraday cage. When the IC is installed within an external circuit, the selected leads are coupled together outside the IC package to complete the Faraday cage. For example, in one embodiment, the IC is inserted into an IC socket on an external circuit board that couples each of the selected leads to a conductive ground plane on the underside of the circuit board. The conductive connections within the IC socket and the ground plane thus form the lower portion of the Faraday cage. It should be appreciated that the term "selected leads," as used herein, can include all of the leads of the corresponding IC package.

By using the leads of the IC package to implement a Faraday cage, no additional real estate on the surface of a corresponding circuit board is required for external ground pads. Also, little or no additional assembly time is typically required to install an IC having an integrated Faraday cage. Furthermore, the close proximity of the leads of most IC packages allows a Faraday cage to be implemented that is capable of suppressing relatively high frequency levels. As operational frequencies get higher, the number of leads that are used to implement the Faraday cage can be increased (e.g., every second lead rather than every third lead in a row of leads). The principles of the present invention can be implemented in any type of integrated circuit requiring a reduction in the level of radiated energy. The inventive principles are particularly beneficial for use with microprocessors and other digital processing devices.

FIG. 1 is a simplified top view of an integrated circuit (IC) 10 that can be modified in accordance with the present invention. The IC 10 includes an IC package having a body 12 and a plurality of conductive leads 14. As shown, the conductive leads 14 are distributed about an outer periphery of the body 12. The package body 12 houses one or more semiconductor chips (not shown in FIG. 1) that have circuitry formed upon a surface thereof. The leads 14 are operative for, among other things, providing electrical communication between the semiconductor chip(s) within the body 12 of the package and circuitry outside the package (not shown in FIG. 1). Conductive interconnects are provided within the body 12 of the IC package to couple the leads 14 of the package to operative portions of the semiconductor chip(s) in a desired manner.

Figure 2:
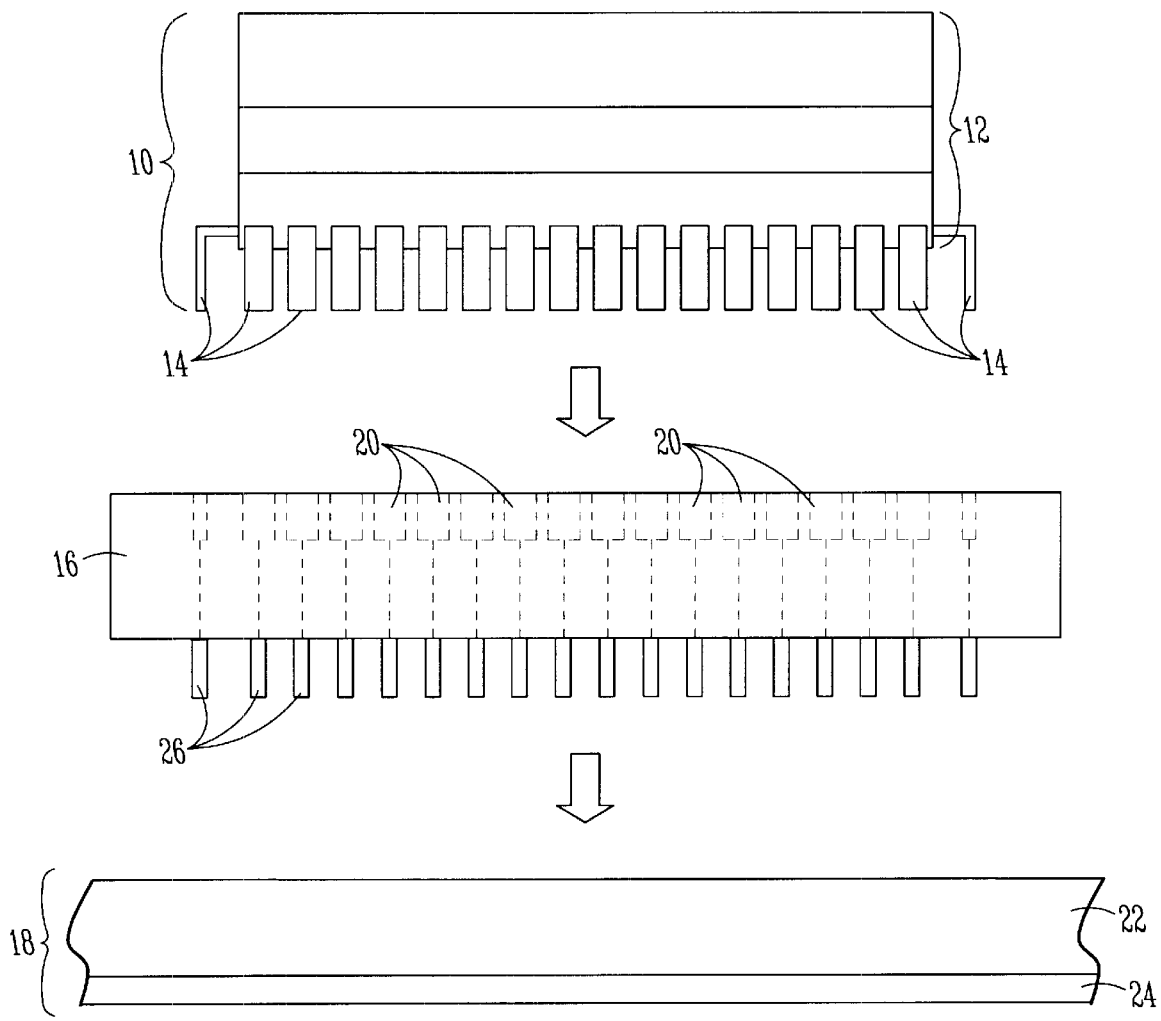
FIG. 2 is an exploded side view illustrating one possible technique for electrically coupling the IC of FIG. 1 to an external circuit.

FIG. 2 is an exploded side view illustrating one possible technique for electrically coupling the IC 10 of FIG. 1 to an external circuit. As shown, an IC socket 16 is provided as an interface between the IC 10 and a circuit board 18. The circuit board 18 includes a dielectric board material 22 having a conductive ground plane 24 on a lower surface thereof. It should be appreciated that the ground plane 24 can alternatively be located on the upper surface of the board material 22 or, if a multi-layer board is being used, on an intermediate metallization layer thereof. In addition, the ground plane 24 does not need to cover an entire surface of the board material 22 but can instead occupy just a portion of a board surface (e.g., ground fill). The circuit board 18 also includes a plurality of conductive interconnects on an upper surface thereof for forming circuit connections within the corresponding system. For ease of illustration, these conductive interconnects are not shown in FIG. 2. The circuit board 18 can also include one or more intermediate conductive layers between the upper and lower surfaces thereof for use in implementing addition conductive interconnects within the system. Connections between conductive layers of the circuit board 18 are typically implemented using via connections.

As shown, the IC socket 16 includes a plurality of pins 26 on an underside thereof for connection to conductive interconnects on the upper surface of the circuit board 18. Typically, the pins 26 of the IC socket will be soldered to the corresponding interconnects on the circuit board 18, although other connection techniques are also possible. Each of the pins 26 of the IC socket 16 are conductively coupled within the IC socket 16 to a corresponding receptacle 20. Each receptacle 20 of the IC socket 16 is designed to receive a corresponding lead 14 of the IC 10. Typically, the leads 14 of the IC 10 will be press fit into the corresponding receptacles 20 of the socket 16 during system fabrication to provide a low resistance connection between each lead 14 and the corresponding pin 26 of the socket 16. When the IC 10 has been inserted into the socket 16, the conductive interconnects on the upper surface of the circuit board 18 provide a connection between operative portions of the semiconductor chip(s) within the IC package and elements within the external circuitry.

Figure 3:
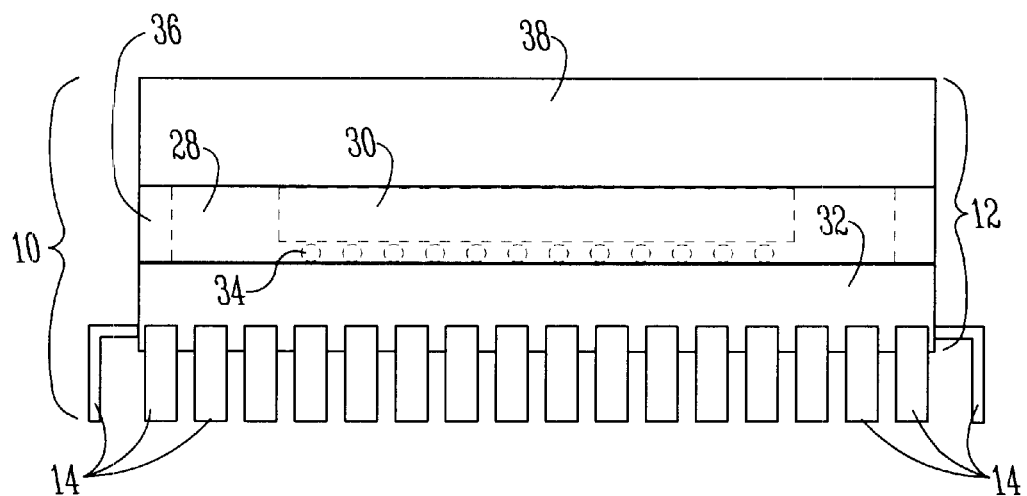
FIG. 3 is a side view illustrating the internal structure of the IC of FIG. 1.

FIG. 3 is a side view illustrating the internal structure of the IC 10 of FIG. 1. As shown, the IC 10 includes an internal cavity 28 having a semiconductor chip 30 residing therein. The semiconductor chip 30 rests above a base portion 32 of the IC package. The base portion 32 of the IC package includes a plurality of conductive interconnects for use in providing electrical communication between the semiconductor chip 30 and the leads 14 of the IC package. These conductive interconnects are often implemented upon a printed circuit board (PCB) within the base portion 32. For ease of illustration, the conductive interconnects are not shown in FIG. 3. The conductive interconnects of the base portion 32 of the IC package may be implemented on a single conductive layer (e.g., using a lead frame approach) or on multiple conductive layers. The semiconductor chip 30 can be connected to the conductive interconnects of the base portion 32 of the IC package in a number of different ways. In the traditional approach, wire bonding techniques are used to provide coupling between operative portions of a semiconductive chip 30 and the conductive interconnects. More recently, simultaneous bonding techniques (such as flip chip methods) have become popular for coupling semiconductor chips to a package substrate. In flip chip technology, conductive contact pads on the surface of a semiconductor chip are first aligned with corresponding pads on the package substrate (e.g., the base portion 32 of FIG. 3). At least one set of pads are covered with small solder bumps before alignment is undertaken. After the pads have been aligned, the assembly is heated and the solder bumps melt, thus coupling the corresponding pads (e.g., see solder connections 34 of FIG. 3). Other techniques for conductively coupling the semiconductor chip 30 to the base portion 32 of the IC package also exist.

As shown in FIG. 3, the internal cavity 28 of the IC 10 is bounded by a wall structure 36 surrounding a periphery of the cavity 28. This wall structure 36 can be separate from or an integral part of the base portion 32 of the package. The wall structure 36 can be made out of any number of different materials including, for example, ceramic, plastic, or metal materials. A package cover 38 is placed over the wall structure 36. In the illustrated structure, the package cover 38 comprises a thermally conductive heat spreader plate that is thermally coupled within the IC 10 to a surface of the semiconductor chip 30 to facilitate heat removal therefrom. Such a heat spreader plate will typically be used when the semiconductor chip 30 is of a type that dissipates large amounts of heat during operation (e.g., a microprocessor or other digital processing unit). Although not shown, a thermal interface compound or structure may be used between the chip 30 and the heat spreader plate to increase heat flow therebetween. A heatsink (not shown) can also be thermally coupled to an external surface of the heat spreader plate to remove heat therefrom during circuit operation.

Figure 4:
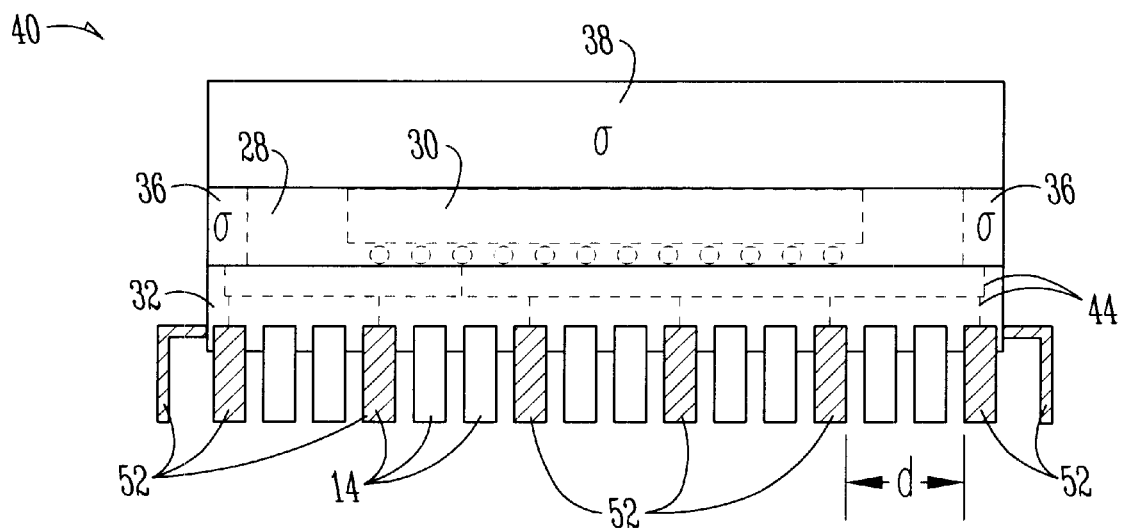
FIG. 4 is a side view of an IC in accordance with one embodiment of the present invention.
Figure 5:
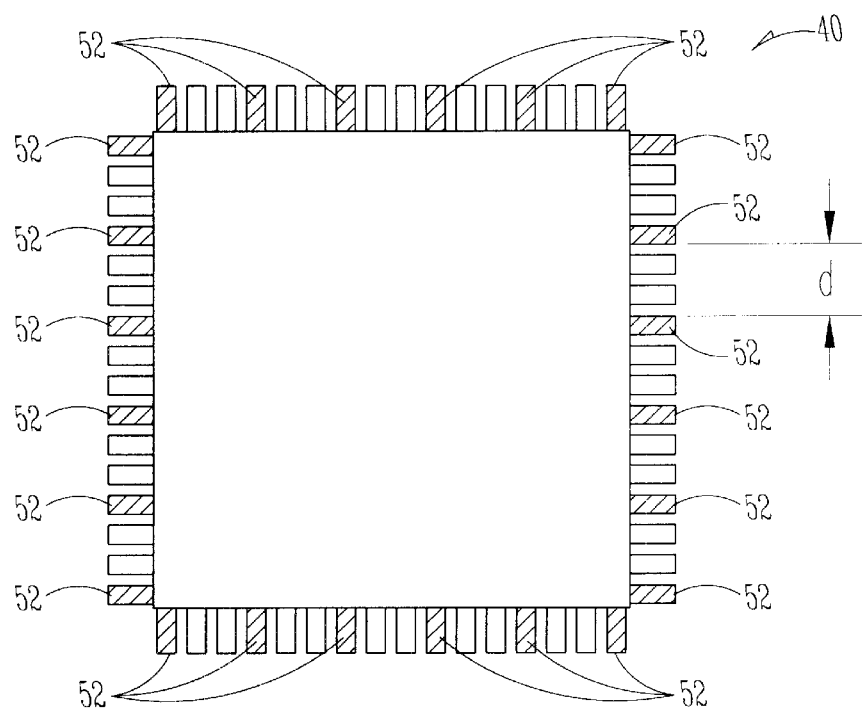
FIG. 5 is a view of the IC of FIG. 4.

FIG. 4 is a side view of an integrated circuit 40 in accordance with one embodiment of the present invention. As described in greater detail below, when the IC 40 is inserted into a properly connected external circuit, a Faraday cage is formed about the corresponding semiconductor chip 30 that confines electromagnetic radiation from the chip 30 within a bounded region surrounding the chip 30, thus reducing undesirable emissions from the IC 40. A subset of the leads 14 of the IC 40 are selected to form side portions of the Faraday cage. These leads are indicated in FIG. 4 (and all other figures herein) by shading and the reference numeral 52. In at least one embodiment, all of the leads 14 of the package are selected for use in the Faraday cage. FIG. 5 is a top view of the IC 40 showing that the leads 52 that are used for the Faraday cage occur on all four sides of the package in the illustrated embodiment. The leads 52 are selected so that the distance (d) between adjacent leads 52 is no greater than a distance required to support a Faraday cage effect within the operational frequency range of the IC 40 (which will be referred to hereinafter as the maximum spacing). In the illustrated embodiment, the selected leads 52 are spaced at substantially equal intervals about the periphery of the IC 40. It should be appreciated, however, that the selected leads 52 do not need to be equally spaced as long as the largest distance between adjacent leads 52 does not exceed the maximum spacing.

As illustrated in FIG. 4, the package cover plate 38 of the IC 40 is made out of an electrically conductive material (signified by the Greek letter σ). This can include, for example, aluminum or copper. In addition, the wall structure 36 of the IC 40 is also made out of a conductive material. In the illustrated embodiment, the wall structure 36 is a solid conductive structure. It should be appreciated that non-solid wall structures (e.g., conductive gaskets) can also be used. The package cover plate 38 is conductively coupled to the wall structure 36 using, for example, solder, welding, pressure, or a conductive adhesive (e.g., silver epoxy). In an alternative approach, the package cover 38 and the wall structure 36 are integral with one another. The base portion 32 of the IC package includes a plurality of conductive interconnects 44 that couple the conductive wall structure 36 to the selected leads 52 of the package. In an alternative approach, each of the selected leads 52 are coupled to the wall structure 36 directly using, for example, a conductive post, a via connection, and/or a bond wire. As will be apparent to a person of ordinary skill in the art, virtually any technique can be used for conductively coupling the wall structure 36 to the selected leads 52 as long as the technique maintains the integrity of the Faraday cage within the IC 40.

Figure 6:
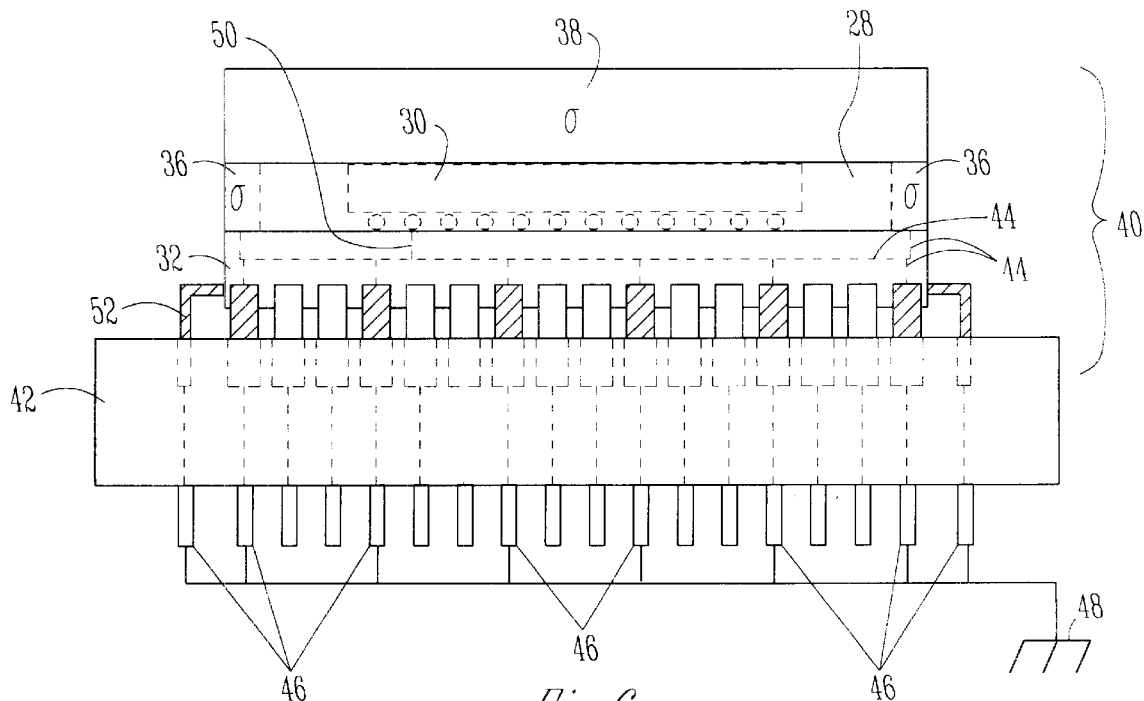
FIG. 6 is a side view illustrating a circuit assembly in accordance with one embodiment of the present invention.

During system assembly, the IC 40 of FIG. 4 is inserted into an external circuit that completes the Faraday cage about the semiconductor chip 30. For example, FIG. 6 is a side view illustrating the IC 40 of FIG. 4 inserted within an IC socket 42 in accordance with one embodiment of the present invention. As shown, the pins 46 of the socket 42 that correspond to the selected leads 52 of the IC 40 are tied to ground 48. Thus, the selected leads 52, the conductive wall structure 36, and the cover plate 38 of the IC 40 are all grounded. In addition, the pins 46 of the socket 42 are coupled to ground in a manner that will form a lower portion of the Faraday cage. In one embodiment, for example, each of the pins 46 is conductively coupled to a ground plane of an underlying circuit board using, for example, via connections through the circuit board. Thus, the ground plane and the vias form a lower portion of the Faraday cage when the IC 40 is inserted into the socket 42. In other embodiments, the socket pins 46 are coupled to a ground fill region on a layer of an underlying circuit board or to an image plane created by the sheet metal of a chassis. As will be apparent to a person of ordinary skill in the art, many other techniques for forming the lower portion of the cage are also possible. In the illustrated embodiment, therefore, the Faraday cage is formed by the package cover 38, the wall structure 36, the interconnects 44, and the selected leads 52 of the IC 40 as well as certain conductors within the socket 42 and the grounding scheme attached to the socket 42. In an alternative embodiment, a conductive plate other than the cover plate of the package (e.g., a heatsink) is used as the upper boundary of the Faraday cage. A heatsink may also be used as the cover plate of the package.

Because the leads 52 of the IC 40 are grounded, the semiconductor chip 30 can use these leads as a ground path. For example, as illustrated in FIG. 6, a conductive line 50 can be provided within the IC package for coupling a ground terminal of the semiconductor chip 30 to the leads 52.

In the embodiment illustrated in FIG. 6, the IC 40 is mounted within a socket 42 to complete the Faraday cage. It should be understood that other external circuit arrangements for completing the Faraday cage are also possible in accordance with the present invention. For example, in one embodiment, an IC is through-hole mounted and soldered directly onto a printed circuit board (PCB). The required ground connections are made by circuitry on the PCB itself. In another approach, the IC is surface mounted to a PCB by aligning leads on the IC package with electrical contacts on the PCB and then simultaneously connecting the leads to the contacts using solder reflow techniques. It should also be appreciated that not all of the selected leads 52 need to be directly coupled to ground outside the IC 40. For example, in one embodiment, the selected leads 52 are each coupled to one another within the IC package (e.g., through the cover plate 38), but only some of the selected leads 52 are directly connected to ground outside the package. The other selected leads 52 are left electrically floating outside the package and are only grounded through the package itself. Although sub-optimal from an EMI suppression standpoint, this approach can be used to reduce the complexity of the exterior circuitry required to implement the Faraday cage.

Figure 7:
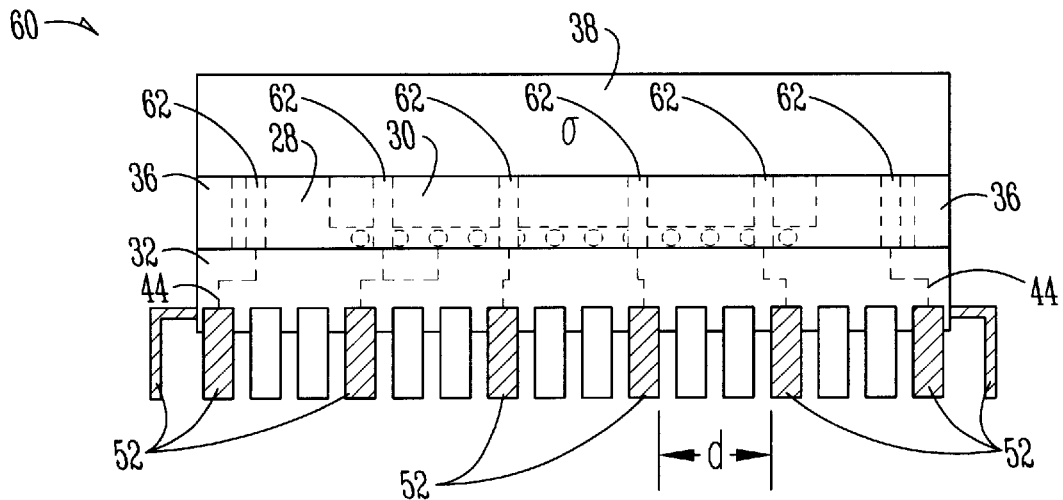
FIG. 7 is a side view of an IC in accordance with another embodiment of the present invention.
Figure 8:
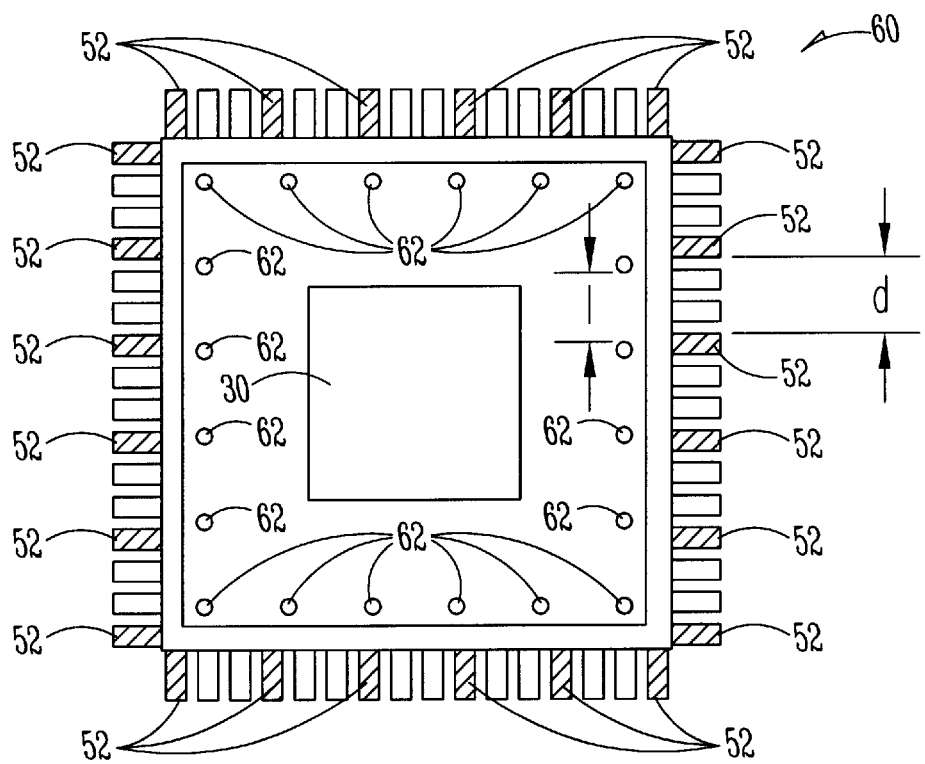
FIG. 8 is a top view of the IC if FIG. 7 with its cover removed.

FIG. 7 is a side view of an IC 60 in accordance with another embodiment of the present invention. As before, to form a complete Faraday cage, the IC 60 needs to be installed into a properly connected external circuit. As shown, the IC 60 includes a number of conductive posts 62 within the internal cavity 28 for conductively coupling the package cover plate 38 to the interconnects 44 of the base portion 32. The conductive posts 62 can be conductively coupled to the cover plate 38 in any of a variety of different ways including, for example, the use of conductive gaskets at the top of the posts 62. FIG. 8 is a top view of the IC 60 of FIG. 7 with the cover 38 removed to show the arrangement of the posts 62 within the IC package. The posts 62 are spaced from one another by a distance 1 that does not exceed the maximum spacing for the frequency range of interest. As long as this spacing is not exceeded, the posts 62 do not need to be equally spaced from one another. In the illustrated embodiment, the interconnects 44 within the base portion 32 of the IC package conductively couple the posts 62 to the selected leads 52. In another embodiment, the posts 62 are directly coupled to the selected leads 52 without the use of intervening interconnects. For example, in one approach, one post 62 is provided for each lead 52 with each post 62 extending from the cover plate 38 to the corresponding lead 52 through the IC 60. The posts 62 can be of virtually any shape or configuration. In addition, other conductive elements, such as wires or foil strips, can alternatively be used. In one approach, instead of discrete conductive elements, a continuous conductive structure (such as a conductive gasket material) is used within the internal cavity 28 to provide conductive coupling between the package cover plate 38 and the interconnects 44.

Because the posts 62 are used to form the portion of the Faraday cage in the cavity area 28 of the IC 60, the wall structure 36 of the IC 60 does not need to be conductive. In one embodiment, the wall structure 36 is non-conductive and the posts 62 are located outside the wall structure 36. The posts 62 can also be implemented using a metallization pattern disposed upon the inside or outside surface of a non-conductive wall structure 36. As will be appreciated by a person of ordinary skill in the art, many alternative schemes for conductively coupling the cover plate 38 to the selected leads 52 are possible.

As described above, the distance between the leads of the IC package that are used to form the Faraday cage will depend upon the highest expected radiation frequency generated by the semiconductor chip during operation. This will generally be the upper bound of the operational frequency range of the chip. As the operational frequencies of ICs increase, the leads that are used to implement the Faraday cage will need to be made closer to one another. Thus, for example, instead of using every third lead within a row of leads on a package to form the Faraday cage (e.g., as in FIG. 4), every second lead can be used. If this does not leave enough leads for other input/output functions of the IC, a package having a higher lead count may be required.

Figure 9:
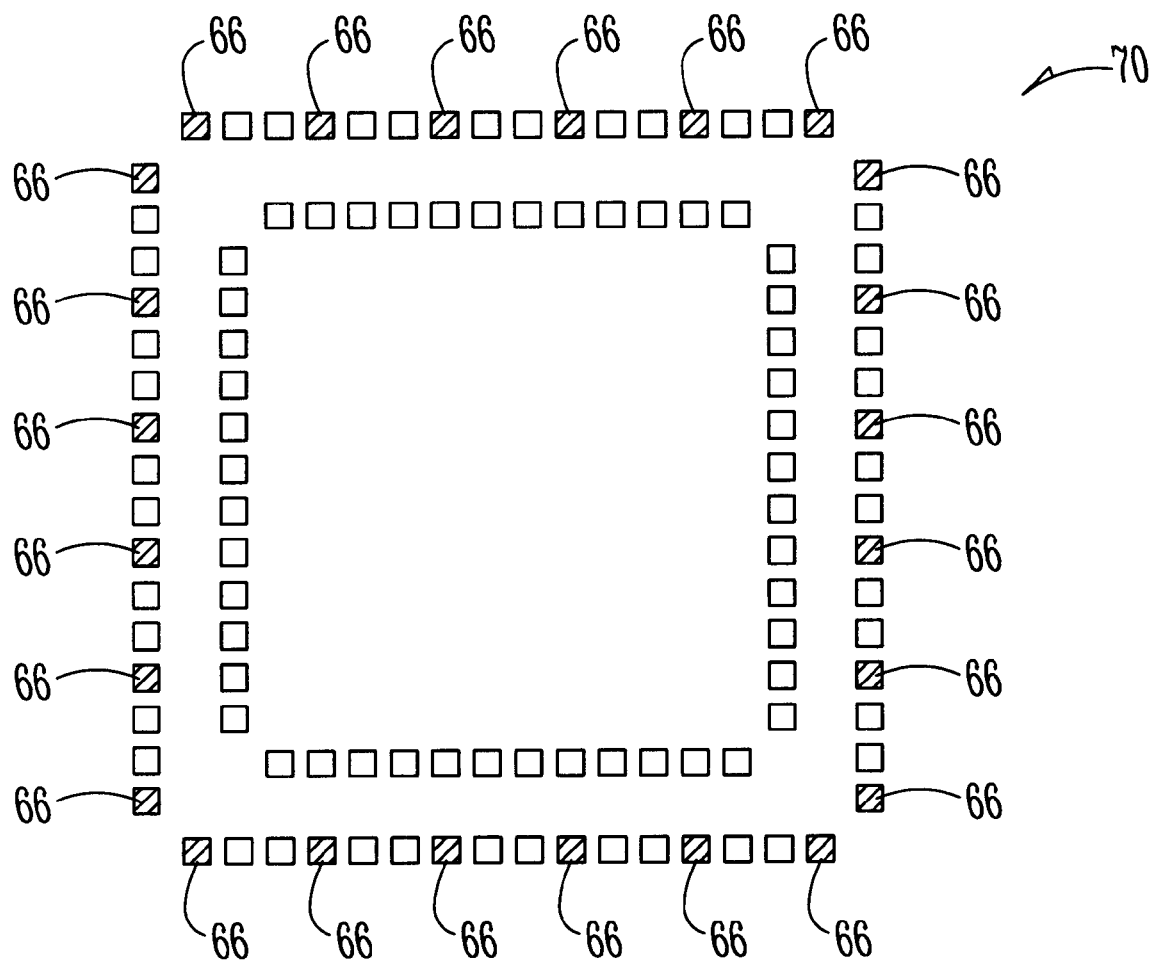
FIG. 9 is a diagram illustrating an IC pin pattern in accordance with one embodiment of the present invention.

In one embodiment of the present invention, a package integrated Faraday cage is implemented within an integrated circuit having multiple rows of leads on each side thereof FIG. 9 is a diagram illustrating a possible lead pattern 70 for such an IC. As shown, there are two rows of leads on each of four sides of the IC. In one approach, the leads that are selected to form the Faraday cage for the IC are all located within the outermost rows of leads on the package. In the illustrated embodiment, for example, every third lead 66 within the outer rows of the lead pattern 70 are selected for use in providing a Faraday cage. It should be appreciated that leads within the inner rows or a combination of leads within both the inner and outer rows can alternatively be used. As before, the distance between adjacent leads 66 should be no greater than the maximum spacing for the frequency range of interest.

It should be appreciated that the leads of an IC implementing the inventive principles do not need to be along the outer edge of the IC package as described thus far. For example, in one embodiment, the invention is implemented within an IC package having leads distributed over a large portion of one of the surfaces of the package (e.g., a through-hole mounted pin grid array (PGA) or a surface-mounted ball grid array (BGA)). As in the multiple row embodiment described above, the leads or pins that are selected to implement the Faraday cage in such a package will preferably be toward the outer edge of the corresponding array (i.e., PGA or BGA).

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. An integrated circuit (IC) comprising:
    a semiconductor chip having circuitry disposed upon a surface thereof; and
    an IC package housing said semiconductor chip, said IC package having a plurality of leads to provide electrical communication between said IC and an exterior environment, said plurality of leads including a subset of leads that are conductively interconnected within said IC package to form a portion of a Faraday cage to surround said semiconductor chip during circuit operation, said subset of leads being distributed on an exterior portion of said IC package and having a spacing between adjacent leads that does not exceed a spacing required to block electromagnetic radiation within an operational frequency range of said integrated circuit.

2. The integrated circuit of claim 1, wherein:
said IC package includes a conductive plate forming an upper boundary of said Faraday cage.

3. The integrated circuit of claim 1, comprising:
a conductive line to conductively couple a ground terminal of said semiconductor chip to said subset of leads.

4. The integrated circuit of claim 1, wherein:
said Faraday cage is not complete until said IC is installed within an external circuit that conductively couples at least some of said subset of leads together outside said IC package.

5. The integrated circuit of claim 2, wherein:
said conductive plate is a cover plate of said IC package.

6. The integrated circuit of claim 2, wherein:
said conductive plate is a heat spreader plate that is thermally coupled to said semiconductor chip to facilitate heat removal from said semiconductor chip during integrated circuit operation.

7. The integrated circuit of claim 2, wherein:
said conductive plate is part of a heat sink.

8. The integrated circuit of claim 2, wherein:
said IC package includes at least one conductive member coupling said conductive plate to said subset of leads.

9. The integrated circuit of claim 8, wherein:
said at least one conductive member includes a wall structure surrounding said semiconductor chip.

10. The integrated circuit of claim 8, wherein:
said at least one conductive member includes a plurality of discrete conductive elements distributed within an internal cavity of said integrated circuit.

11. The integrated circuit of claim 8, wherein:
said at least one conductive member includes a plurality of conductive interconnects associated with a circuit board within said integrated circuit.

12. An integrated circuit comprising:
    a semiconductor chip having circuitry disposed upon a surface thereof; and
    a package housing said semiconductor chip, said package including:
        a conductive plate;
        a plurality of leads to provide electrical communication between said integrated circuit and an exterior environment; and
        at least one conductive member to conductively couple said conductive plate to a subset of leads within said plurality of leads, said subset of leads being distributed on an exterior portion of said package and having a spacing between adjacent leads that does not exceed a spacing required to block electromagnetic radiation within an operational frequency range of said integrated circuit.

13. The integrated circuit of claim 12, wherein:
said at least one conductive member includes a conductive wall structure surrounding said semiconductor chip.

14. The integrated circuit of claim 12, wherein:
said at least one conductive member includes a plurality of discrete conductive elements distributed within an internal cavity of said integrated circuit.

15. The integrated circuit of claim 12, wherein:
said at least one conductive member includes a plurality of conductive interconnects associated with a circuit board within said integrated circuit.

16. The integrated circuit of claim 12, wherein:

said plurality of leads includes multiple rows of leads distributed on an exterior portion of said package, said multiple rows of leads including an outermost row of leads, said subset of leads being located within said outermost row of leads.

17. The integrated circuit of claim 12, wherein:

said plurality of leads includes a grid array.

18. The integrated circuit of claim 12, wherein:

said conductive plate includes a cover plate of said package.

19. The integrated circuit of claim 12, wherein:

said conductive plate includes a heat spreader plate that is thermally coupled to said semiconductor chip to facilitate heat removal from said semiconductor chip.

20. The integrated circuit of claim 12, wherein:

said conductive plate includes a heat sink.

21. The integrated circuit of claim 13, wherein:

said conductive wall structure includes a conductive gasket material.

22. An electrical apparatus comprising:

an integrated circuit including:
- a semiconductor chip having circuitry disposed upon a surface thereof; and
- a package housing said semiconductor chip, said package including:
  - a conductive plate;
  - a plurality of leads to provide electrical communication between said integrated circuit and an exterior environment;
  - at least one conductive member to conductively couple said conductive plate to a subset of leads within said plurality of leads said subset of leads siad subset of leads are distributed on an exterior portion of said package, said subset of leads having a spacing between adjacent leads that does not exceed the spacing required to block electromagnetic radiation within an operational frequency range of said integrated circuit.

a circuit board assembly carrying said integrated circuit, said circuit board assembly conductively coupling at least some of said subset of leads to a ground terminal outside of said package;

wherein said conductive plate, said at least one conductive member, and said subset of leads collectively form a portion of a Faraday cage surrounding said semiconductor chip.

23. The electrical apparatus claimed in claim 22, wherein:

said integrated circuit is mounted in an IC socket on said circuit board assembly.

24. The electrical apparatus claimed in claim 22, wherein:

said integrated circuit is through-hole mounted on said circuit board assembly.

25. The electrical apparatus claimed in claim 22, wherein:

said integrated circuit is surface mounted on said circuit board assembly.

26. The electrical apparatus claimed in claim 22, wherein:

said subset of leads are conductively coupled to a ground plane of said circuit board assembly, said ground plane forming a lower boundary of said Faraday cage.

27. The electrical apparatus claimed in claim 22, wherein:

said circuit board assembly conductively couples each of said subset of leads to said ground terminal outside of said package.

28. The electrical apparatus claimed in claim 22, wherein:

said conductive plate, said at least one conductive member, said subset of leads, and said circuit board assembly collectively form a Faraday cage surrounding said semiconductor chip.

* * * * *

UNITED STATES PATENT AND TRADEMARK OFFICE
CERTIFICATE OF CORRECTION

PATENT NO. : 6,515,870 B1
DATED : February 4, 2003
INVENTOR(S) : Harry G. Skinner and Sam E. Calvin It is certified that error appears in the above-identified patent and that said Letters Patent is hereby corrected as shown below:

Title page,
Item [56], References Cited, U.S. PATENT DOCUMENTS, insert the following:
-- 5,998,969     12-1999         Tsuji et al.     320/130 --.

Column 2,
Line 9, insert -- top -- before "view".
Line 14, delete "if" and insert -- of -- therefor.

Column 7,
Line 20, insert -- . -- after "thereof".

Column 9,
Line 35, delete "siad subset of leads" before "are".

Signed and Sealed this

Twentieth Day of July, 2004

JON W. DUDAS
*Acting Director of the United States Patent and Trademark Office*